(12) United States Patent
Sekhar et al.

(10) Patent No.: US 9,643,877 B2
(45) Date of Patent: May 9, 2017

(54) THERMAL PLASMA TREATMENT METHOD (71) Applicants: Jainagesh Sekhar, Cincinnati, OH (US); Michael Connelly, Cinicnnati, OH (US)

(72) Inventors: Jainagesh Sekhar, Cincinnati, OH (US); Michael Connelly, Cinicnnati, OH (US)

(73) Assignee: MHI Health Devices, LLC., Cincinnati, OH (US)

( * ) Notice: Subject to any disclaimer, the term of this patent is extended or adjusted under 35 U.S.C. 154(b) by 112 days.

(21) Appl. No.: 14/578,685

(22) Filed: Dec. 22, 2014

(65) Prior Publication Data

US 2015/0181685 A1    Jun. 25, 2015

Related U.S. Application Data

(60) Provisional application No. 61/919,980, filed on Dec. 23, 2013, provisional application No. 61/925,719, filed on Jan. 10, 2014.

(51) Int. Cl.

| | |
|---|---|
| H05H 1/24 | (2006.01) |
| C03B 23/00 | (2006.01) |
| H01J 37/32 | (2006.01) |
| B23K 1/00 | (2006.01) |
| B23K 1/005 | (2006.01) |

(Continued)

(52) U.S. Cl.
CPC ........ *C03B 23/0066* (2013.01); *B23K 1/0018* (2013.01); *B23K 1/0056* (2013.01); *B23K 1/20* (2013.01); *B23K 35/0244* (2013.01); *C03B 29/00* (2013.01); *C03B 29/025* (2013.01); *H01J 37/3233* (2013.01); *B23K 2201/001* (2013.01); *B23K 2203/04* (2013.01); *B23K 2203/08* (2013.01); *B23K 2203/12* (2013.01); *B23K 2203/14* (2013.01); *B23K 2203/18* (2013.01); *B23K 2203/20* (2013.01); *B23K 2203/26* (2015.10); *B23K 2203/52* (2015.10); *B23K 2203/54* (2015.10); *B23K 2203/56* (2015.10)

(58) Field of Classification Search
CPC .............. H05H 1/34; H05H 2001/3452; H01J 37/3233; B23K 10/02
See application file for complete search history.

(56) References Cited

U.S. PATENT DOCUMENTS 5,963,709 A     10/1999  Staples
6,397,776 B1 *  6/2002  Yang .................... C23C 16/401
                                                    118/719

(Continued)

OTHER PUBLICATIONS

Choi et al. Thermal cleavage on glass by a laser-induced plume, Optics and Lasers in Engineering, 53(2014, published online Sep. 2013) pp. 60-68.*

*Primary Examiner* — Kelly M Gambetta
(74) *Attorney, Agent, or Firm* — Michael C. Connelly (57) ABSTRACT

Presented is a method for the surface treatment of objects utilizing thermal plasma, including cascade plasma, and a wrap, such as tape or foil, where the tape or foil attracts the specific part of the plasma which produces a heat necessary to produce the desired treatment. The specific surface treatment may include, but is not limited to, hard-facing, brazing, welding, other types of joining operations, glass bending or forming, glass texturing, coating and surface reconditioning.

11 Claims, 6 Drawing Sheets

(51) Int. Cl.

| | |
|---|---|
| *B23K 1/20* | (2006.01) |
| *B23K 35/02* | (2006.01) |
| *C03B 29/00* | (2006.01) |
| *C03B 29/02* | (2006.01) |
| *B23K 101/00* | (2006.01) |
| *B23K 103/08* | (2006.01) |
| *B23K 103/14* | (2006.01) |
| *B23K 103/04* | (2006.01) |
| *B23K 103/12* | (2006.01) |
| *B23K 103/18* | (2006.01) |
| *B23K 103/20* | (2006.01) |
| *B23K 103/00* | (2006.01) |

(56) References Cited

U.S. PATENT DOCUMENTS

| | | |
|---|---|---|
| 6,816,671 B1 | 11/2004 | Reddy et al. |
| 8,895,888 B2 | 11/2014 | Burada et al. |
| 2007/0269612 A1* | 11/2007 | Bijker ............... C23C 4/12 427/569 |
| 2012/0220138 A1* | 8/2012 | Van Gerwen ......... C23C 16/54 438/791 |

* cited by examiner

THERMAL PLASMA TREATMENT METHOD

CROSS REFERENCE TO RELATED APPLICATIONS

This patent application claims the benefit of provisional patents application Ser. No. 61/919,980, filed on Dec. 23, 2013 and application Ser. No. 61/925,719, filed Jan. 10, 2014 by the present applicants, the disclosures of which are incorporated by reference herein in their entirety.

BACKGROUND

Field

This application presents a method for the surface treatment of objects utilizing thermal plasma, including cascade plasma, and a wrap, such as tape or foil, where the tape or foil attracts the specific part of the plasma which produces a heat and other properties necessary to produce the desired treatment. The specific surface treatment may include, but is not limited to, hard-facing, brazing, welding, other types of joining operations, glass bending, shaping or forming, glass texturing, coating and surface reconditioning.

Prior Art

Past and current heat treatment methods used for processes including hardening, curing, annealing, normalizing, melting, peening and coating often require long heat-up and hold times due the nature of the heat source or types, such as, for example, induction heating. Dwell times up to, and at, temperature are, at times, longer than is necessary. These long dwell times lead to oxidation and discoloration problems associated with work pieces as well as general inefficiency of the process itself. Other heat treatment methods which employ combustion or open flames are environmentally unfriendly and are generally hazardous and energy inefficient. Often combustion flames introduce impurities as well.

Presently, the energy inefficiency of many heat treatment methods is due to lengthy ramp-up and hold times as well as heat losses caused by the design and construction of equipment and manner of operation. Substantial fuel and heat losses occur during flame or combustion methods and their usage is limited to specific materials and processes.

SUMMARY

A method whereby high temperature plasma, including thermal cascade plasma, is employed to obtain an effective and advantageous heat treatment system useful in a variety of situations, is presented in this application. It is contemplated that the plasma will be supplied by the use of a plasma generator, such as the e-Ion Plasma™ produced by MHI, Inc., which allows for unique applications of ions, electrons, radiation and hot gases. As a new alternative to electron, laser, induction, and RTP heating methods thermal plasma uses less energy, produces less noise and is safer than traditional heating methods. The plasma, or thermal plasma contemplated by the present application is the type produced by the apparatus claimed in U.S. Pat. No. 8,895,888 entitled "Anti-Smudging, Better Gripping, Better Shelf-Life of Products and Surfaces", U.S. Pat. No. 5,963,709 entitled "Hot Air Blower Having Two Porous Materials And Gap Therebetween" and U.S. Pat. No. 6,816,671 entitled "Mid Temperature Plasma Device" which are each incorporated by reference in their entirety.

The present method uses electricity and just air (or any other gas) to produce a high temperature thermal plasma plume that contains ions, electrons, radiation and hot gas. This type of plasma is differentiated from plasma which is generated due to a mere electric potential. The First Ionization Energy of an element (atom) is utilized in this method. The First Ionization Energy is the energy needed to remove the outermost electron from a neutral atom in the gas phase. When recombination with an electron occurs for the ionized atom, tremendous heat is generated. Thus rapid heating of a surface/substrate is the result.

This method provides non-contact, continuous heating with accurate temperature control in compact versatile use designs. The method can provide normalizing, stress relieving, annealing, hardening, curing, deformation (bending or shaping), surface melting and coating. Processes may be completed while wire or cable is moving through the high temperature plasma environment. This type of heating provides the rapid high temperature heating necessary for melting and heat treating. Anticipated applications include, but are not limited to; stress relieving, annealing, hardening, curing, surface melting, surface coating, hard-facing, powder sintering, compacting to a substrate, creating high hardness surfaces, coating formation (rapid manufacturing of tungsten carbide-Co alloys with excellent bonding on any metal platform), powder processing, thin film treatment and processing, densification of materials (ceramics, powders, metals, etc.) and creating/treating highly wear/abrasion resistant surfaces. Radiant heat may also be applied concurrently with the application of, or immersion in, plasma. It has been found that this process can effectively bend, form and texture glass. Spent abrasive wheels can be reconditioned by the application of thermal plasma to grinding surfaces. Drill bits and other cutting tools may be treated with thermal plasma resulting in harder and longer lasting cutting surfaces. Old cutting tooling may be reconditioned by application of thermal plasma as well.

It is an object of this invention to provide a device and method for heating a gaseous flow that can impart plasma to the flow. A device for heating a gaseous flow is provided having a first materials, a second materials, and a heat source. The first materials has an inlet side for receiving the gaseous flow, an inner side for discharging the gaseous flow, and a plurality of openings, the openings providing at least one passageway for the inlet side to the inner side. The first materials preferably comprise porous ceramic materials.

The second materials has an inner side for receiving the gaseous flow, an outlet side for discharging the gaseous flow, and a plurality of openings, the openings providing at least one passageway from the inner side to the outlet side. The inner side of the first materials and the inner side of the second material define a gap for providing residence time for gases passing therethrough. Preferably, the second material comprises a porous ceramic material. It is also preferred that the ratio of the volume of the materials to the volume of the gap is 3. The heat source is in direct or indirect contact with the gaseous flow and provides heat thereto. Preferably, the heat source is an electric heating element.

Figure 6:
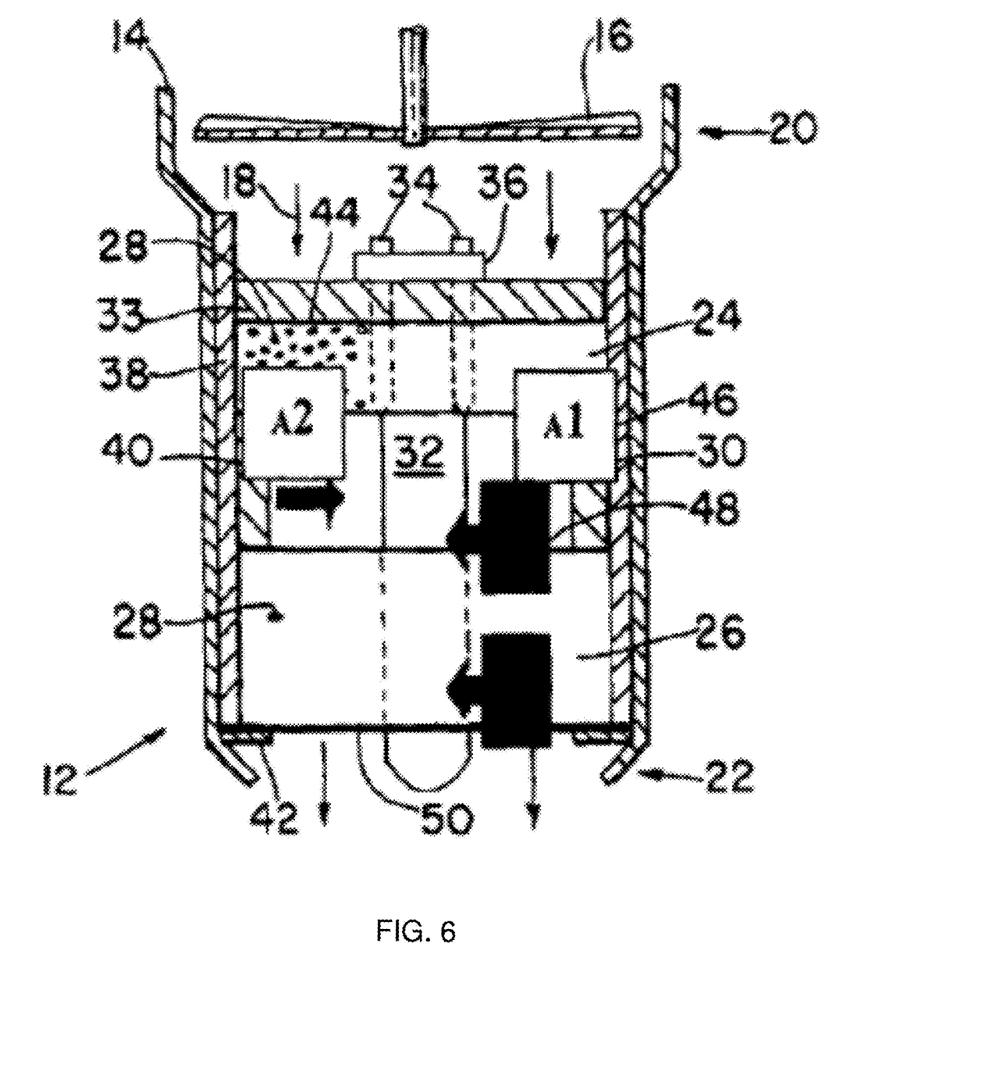
FIG. 6 is a cut-away view of an embodiment of a thermal plasma generator as contemplated in an embodiment of the present apparatus.

As shown in FIG. 6, hot plasma blower 12 has a housing comprising a stainless steel shell 14 configured in a substantially cylindrical shape. The blower 12 has an inlet end 20 and an outlet end 22. A fan 16 is disposed near the inlet end 20 for receiving a gaseous flow, depicted by the arrows 18, so that the gaseous flow can be directed through the blower 12 from its inlet end 20 toward its outlet end 22. Fan 18 is preferably driven by an electric motor (not shown).

The gaseous flow 18 to be heated by the blower 12 can comprise a variety of gases or combinations of gases, preferably so that the gases are not chemically reactive when heated to a temperature at which the blower will operate. For example, the gaseous flow 18 can be air that is to be heated and applied to a part or chamber. Also, the gaseous flow can be engine exhaust having particulates that are to be incinerated by the heat of the blower 12. Moreover, although the blower 12 is depicted in its vertical position in FIG. 6, it may be operated in a horizontal manner or at any angle to horizontal.

As shown in FIG. 6, the blower preferably has an insulating liner 38 adjacent the interior surfaces of shell 14 for preventing loss of heat from the interior of the blower. Insulating liner 38 can comprise any insulating material that is physically and chemically stable at the temperature at which the blower is to operate, such as alumina silica fibers, micro quartz fiber and the like.

As is also shown by FIG. 6, the representative embodiment further includes a first material 24 and a second material 26 disposed within the shell 14. The first material 24 includes an inlet side 44 for receiving a gaseous flow (depicted by arrows 18), from the fan 16 and an inner side 46 for discharging the gaseous flow. The second material 26 includes an inner side 48 for receiving the gaseous flow discharged by the first material 24, and an outlet side 50 for discharging this gaseous flow. Preferably, the outer edges of the first and second materials 24 and 26 directly abut the interior surface of the liner 38 such that there is no gap between the liner and the sides of the materials. It is also preferred that the materials 24 and 26 are spaced apart along the longitudinal axis of the blower 12 such that a gap 30 is formed between the two. Spacer 40 can be utilized to maintain the gap 30 between the inner sides 46 and 48 of the first and second materials 24 and 26. The spacer 40 is preferably comprised of an alumina silica cylindrical refractory. Ledge 42 may be utilized to help maintain the materials 24 and 26 at a desired location within the shell 14; the second material 26 can be placed upon the ledge, the spacer 40 may be placed upon the second material, and the first material 24 may be placed upon the spacer. Alternatively, the materials 24 and 26 can be secured to the shell using any manner known in the art such as by bolting, clamping, or the use of high temperature adhesives.

The first material 24 contains a plurality of pores 28 (shown schematically in FIG. 6) that provide at least one passageway for a gaseous flow to travel from the inlet side 44 to the inner side 46. Similarly, the second material 26 also contains a plurality of pores 28 that provide at least one passageway from the inner side 48 to the outlet side 50 of the material. Preferably, the pores 28 within the first material 24 are interconnected so as to provide a plurality of passageways through the material. Similarly, it is preferred that the pores 28 within the second material 26 are interconnected.

The heating element should be made of a resistive material such that it becomes heated as an electric current passes there through as is well known in the art. The element can comprise any number of resistive materials suitable for obtaining a high temperature when an electric current passes there through. For example, the element can comprise a metallic material such as iron or nickel based alloys, iron or nickel based alloys containing aluminum and niobium, nickel aluminide, molybdenum disilicide (or other molybdenum silicides), silicon carbide, nickel chromium alloy, and the like. Conventional U-shaped elements based on molybdenum disilicide, silicon carbide, zirconia, carbon or boron nitride can be heated up to a 1900° C element temperature. While the heating element is shown as a U-shaped in FIG. 6, it is to be understood that the heating element can comprise any number of shapes and types as are well known in the art. For example, the heating element can have a multiple number of connected U-shaped members or can be provided in a spiral shape or as coil shape or combinations. In one embodiment of this invention we provide for adding tungsten or tungsten bearing compounds to the heating element itself in order to obtain a convective plasma output from the product of this invention.

Furthermore, it is contemplated that hot air could be drawn directly out of the gap as it is simultaneously drawn from the outlet end of the blower or compressor or gas bottle delivering the gas. Moreover, additional fans may be utilized to aid in drawing the air from the blower. It is also contemplated that fins or baffles be utilized within the gap to aid in increasing residence time and raising the temperature of the air output from the fan. In operation, the blower, fan or compressor forces air (or other gas, if desired) into the inlet. When the air reaches the first material, it travels from the inlet side, through the pores, and out the outlet side. As noted above, the pores preferably provide a plurality of passageways through which the air may travel. It is even more preferred that the passageways have several turns and twists so that the air travels a "tortuous" path, as is known in the art. As also noted above, the pores within the material are preferably interconnected so that each pore is connected to a plurality of passageways extending from the inlet side to the inner side. The first material has a preferred porosity of 10 pores per inch, each pore having a diameter of about 0.01 inches.

The tortuous path provided by the pores serves at least two functions. First, as air travels the tortuous path, it absorbs the heat retained by the first material and received from the heating element. This preheating of the air helps to prevent the heating elements from cracking, as metallic elements have been known to do when they come in contact with air that is too cool relative to the temperature of the element. The amount of preheating that occurs depends upon the thickness of the material, the porosity of the material, and the size of the pores. The greater the thickness and porosity of the material, the more tortuous will be the path. The larger the pore size, the less tortuous the path.

The second function of the tortuous path is to help to prevent air from escaping the blower in the opposite direction of the intended flow. Thus, although air that becomes heated will have a tendency to rise from the inner side to the inlet side when the blower is used in the vertical position, the air will have difficulty doing so due to the complex and turbulent flow experienced within the gap upon exiting the material.

Once the air is discharged from the inner side, it enters the gap defined by the first material, the second material and the interior wall of the spacer. The gap can also be described as a cavity, space, or chamber. When air travels through the gap, it receives heat from the element by convection and radiation. The gap provides residence time for the air traveling from inner side of the first material to the inner side of the second material to become heated by the element. It is also believed that a complex combination of turbulent flow, convective flow, and recirculation zones occurring within the gap contribute to the heat imparted to the gas therein. Thus, when the air reaches the inner side of the second material, it has a higher temperature than when it first entered the gap through the inner side of the first material.

Like the first material, the second material also have a number of pores which are preferably interconnected so as to provide a tortuous path from the inner side to the outlet side of the material. It is also preferred that the second material have the same porosity of the first material. As in the first material, the pores of the second material provide a tortuous path for air traveling through the second material and cause the air to rise even higher in temperature as it travels through the material. The element in addition to being disposed within the gap, is preferably also disposed within the second material so as to provide additional heating of the air. The air is finally discharged through the outlet side of the second material and out the outlet end of the blower where is can be utilized by the user. Due to the tortuous paths provided by the materials and, the residence time provided by gap, the air exiting the blower at the outlet end is at a higher temperature than air brought into the blower through the inlet end.

Figure 1:
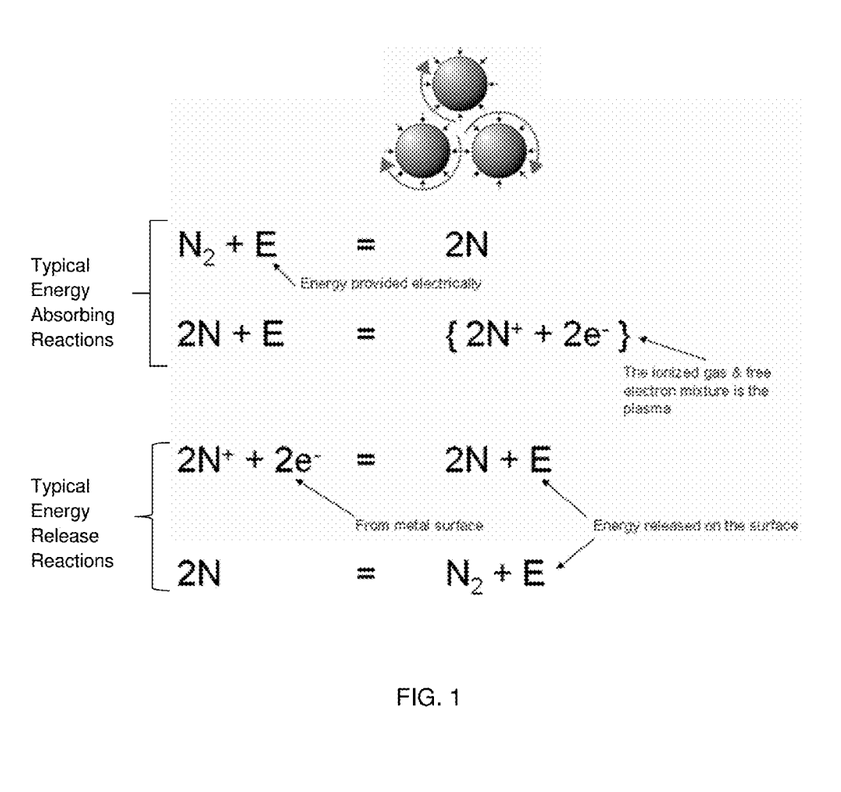
FIG. 1 is a representation of the heating potential for activated ionization including recombination reactions that produce the localized energy release which is the basic principle of the present process.

The First Ionization Energy of an element (atom) is the energy needed to remove the outermost electron from a neutral atom in the gas phase. When recombination with an electron occurs for the ionized atom, tremendous heat is generated. Thus rapid heating of a surface/substrate is the result. High temperature thermal plasma treatments are able to transfer the ionic species and cause recombination to occur where the heat and electric field is required. The thermal plasma itself is a remarkable scientific achievement. A graphic of the heating potential is shown in the FIG. 1 for activated ionization. The last two reactions are the recombination reactions that produce intense localized energy release, often in the form of heat. Although nitrogen is used for the example in FIG. 1, almost all gases can be used.

DRAWINGS

Figures

DETAILED DESCRIPTION

In an embodiment of the method, a coating, slurry, braze or other material is applied to the surface of an object. The substrate and the applied medium are then wrapped with a tape or foil. The tape or foil may be composed in part, or in total, of carbon or carbon material. A film of powder may be used as or in place of the foil. The substrate, applied material and wrapping are subjected to thermal plasma. The wrapping acts to attract the plasma or specific parts of the plasma in a manner that leads to rapid heat-up of the wrapped areas. The surface treatment is thus performed in a more efficient manner as compared to currently used processes that require far greater time and energy.

The method and apparatus of the method and the compositions of the foil and treatable combinations are special and involve selective ion electron combinations, particularly ones that change with temperatures. Activity increases above 1100° C. Copper brazing, hardfacing and de-burring become particularly effective when tape of the correct pliability (wrap around) is employed. The thickness and number of layers is important as are the molecular weight distribution and fillers in the organic tapes used. Specific embodiments and contemplated uses are discussed and presented below.

Even when using plasmized-air, the heat-up rate and ionic atmosphere (which is reducing), are conducive for high quality brazing or joining type operations. Dissimilar metals like Aluminum and iron or metal ceramic composites are often easy to braze with thermal plasma and the above method. Redox and/or precursor solutions and gasses for forming oxides, carbides, nitrides, carbonitrides, phosphides, arsendides and combinations and mixtures are fully anticipated. With this technique, antibacterial/antimicrobial/anti-prior/anti-fungus (both dry and wet biofilms) and nano-structures compositions are easily considered for surface enhancements. The applications of amorphous materials further crystallized or directly applied crystallized are also anticipated.

Figure 2:
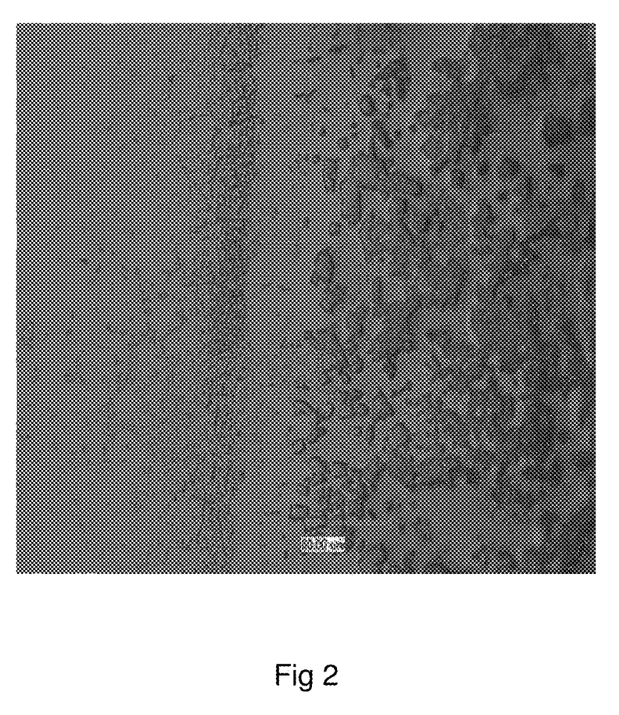
FIG. 2 is the microstructure of nano-grained cemented tungsten carbide (n-WC) treated by the present method.
Figure 3:
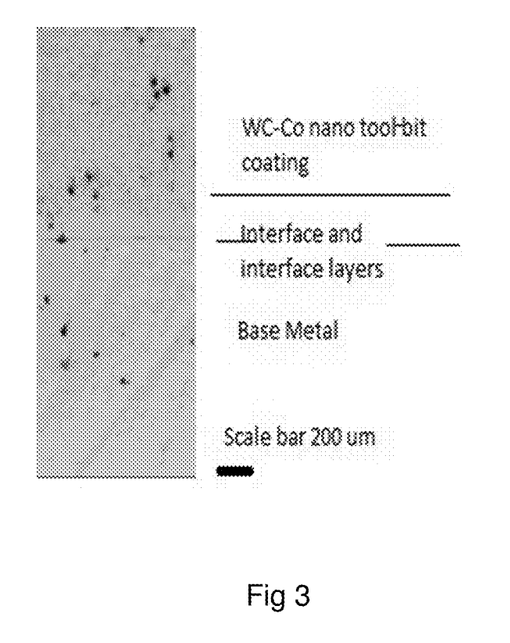
FIG. 3 is a picture of the microstructure a high integrity bond for hard-facing and tool bits produced by the method.
Figure 4:
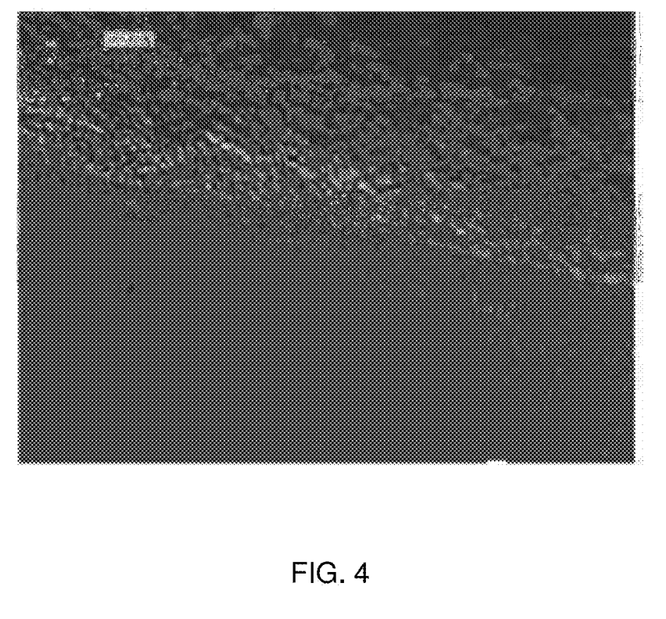
FIG. 4 is the microstructure of NiCoMo hard-facing alloy applied to steel treated by the present process.

Wear resistant surfaces may be made within seconds or minutes with this method by immersing in a plasma plume which may represent an increase of over 100 fold in productivity with lower capital cost and operating costs. Shown in FIGS. 2-4 are typical hard-facing interface microstructures obtained with tungsten carbide nano and with hard-facing/hard surfacing alloy on a stainless steel substrate. Fractal dimensional coatings and compositional compositions are easily enabled by tape for multi-gradient brazing, welding and joining and solidification. The surface in FIG. 2 of n-WC was obtained after short exposure to thermal plasma. Other processes are often noted to produce much coarser microstructures. Nano grained cemented tungsten carbide (n-WC) is currently being researched for many potential applications. Thermal plasma treated micrographs of n-WC (FIG. 2) and NiCoMo hard-facing braze alloy to steel (FIG. 4) display excellent hard-face bonding to the substrate as well as very fine and uniform particle size. A high integrity bond for hardfacing and tool bits result in savings of considerable time and energy (FIG. 3).

TABLE 1

Brazing alloys and the thermal plasma treating method

| | | |
|---|---|---|
| Titanium (Ti) brazing early stages of compressor or exhaust | Dissimilar Metal/Ceramic Brazing | Nickel copper 59 Ni |
| New braze compositions | Platinum | Palladium |
| New engine crack repair | Braze Alloy | Au-6 (Gold) |
| Compressor Parts | Hastelloy, Inconels, Waspalloy | Iron Boron Silicon |
| Auxiliary Power Unit (APU) | Implants | Nickel Boron Silicon |
| Fuel systems/compressor inlets | 304 ss or Inconel 600, 625 or RA alloys | Gold 82/Nickel 18 alloy) |

TABLE 1-continued

| Brazing alloys and the thermal plasma treating method | | |
|---|---|---|
| High compressor and low turbine | Stainless Steel | nicro-36-M |
| Fuel systems leak proof braze | 304 ss or Inconel 600, 625 or 718 | NiCroly Ni—Cr—Al, Ni—Al |
| MRO engine repair hot section/high pressure turbine. Abradable Tip | Superalloys of Nickel and Cobalt Biomedical Grade alloys | Pre-sintered preform, paste, paint (PSP) |
| Fuel systems | Low temp like fuel systems | Silcoro-75 |
| Low pressure compressor/Ti brazing | Ti—6Al—4V with Mo and other Ti alloys | TiCuNi and Shape Memory Alloys |

Brazing

Traditionally, brazing ceramics to metals and metals to ceramics has been particularly difficult. Just as when brazing ferrous to nonferrous metals, specific alloys and specialized brazing furnaces are required for successful ceramic to metal joining. These furnaces are large, expensive and typically suitable just for a few applications. This lack of adaptability has meant high initial capital costs, limited applications and high per piece costs.

Thermal plasma technology can facilitate ceramic brazing without issues typically faced by brazing furnaces or laser brazing. No large enclosure is necessary to treat parts. Thermal plasma methods can braze ceramics to metals, metals to ceramics, ceramics to ceramics and metals to metals without the typical requirements of a vacuum environment. Associated equipment can be repositioned with minimal effort, allowing for less downtime between batches and lower capital costs. (One plasma device may replace multiple specialized furnaces). A combination of higher operating temperatures, lower energy consumption and patented technologies allows thermal plasma to braze faster and more cost effectively than alternative technologies.

Lack of wettability makes brazing ceramics difficult. Simply put, it is difficult to ionically bond anything to ceramics. Plate metallization and thin film metallization can be effective in certain circumstances, but high tooling costs and size constraints limit widespread adoption. Thermal plasma devices are easily movable and can easily handle on-line/in-line processing, virtually eliminating size constraints typically found in existing technologies.

Thermal plasma devices may be customized for deposition type and shape. Comparisons of price and energy efficiency between ordinary transferred arc or induction plasma deposition or laser and thermal cascade plasma favor the latter. There are also no electrodes to change in plasmas generators. Noise and pollution are minimized while energy efficiency is improved. Brazable materials include yittria zirconia, boron carbide, silicon carbide, molybdenum disilicide and alumina. Possible applications include: glass and nano surface depositions; tungsten carbide and other high wear resistant surfaces for tool bits; tubes and complex shapes; thick alumina on aluminum; and functionally graded coatings. Thermal plasma methods may also be used to braze or otherwise attach copper to an unclean substrate. The brazing may be successful even in the presence of copper oxide. Such an application runs counter to the current art and thinking which call for completely clean surfaces.

Surface Smoothing & De-burring

Thermal cascade plasma methods can be used for plasma peening. With the method an Ra down to 1-5 um within minutes without the use of harsh chemicals can be obtained. Treatment time with Ionic De-burring varies depending on the starting roughness.

Surface roughness is a measure of the texture of a surface that is commonly reported as an Ra number (the absolute arithmetic average roughness of a surface) or reported with an Rq number (root mean squared RMS value of roughness). The engineering units for both Ra and Rq are either micro inch (u-inch) or micrometers (um). For example: Cast surfaces display Ra of about 50-250 u-inch. Sand castings display the higher roughness, plaster shell type investment castings and die castings show the lower values of roughness. Squeeze castings also display a higher average roughness. There are more advanced reporting procedure that include values for waviness and surface skewness; however Ra and Rq capture the roughness property adequately.

Peening or burring is the process of working a metal-surface to improve its material properties. Ion Peening with thermal plasma is a relatively new process that can be used for curved and complex shapes. The control of surface roughness is important because surface roughness can impact the look-and-feel of products. A bad roughness can affect the durability and reliability of the processed part. Also, roughness impacts life by impacting wear resistance, erosion resistance, fatigue resistance, creep-fatigues interactions and other material design parameters. A bad casting finish can dramatically alter the energy efficiency in any fluid flow device e.g. a pump or turbocharger. High roughness can cause turbulence. Roughness can be controlled with plasma application techniques.

Typically, roughness is called out for metallic, composite and ceramic parts used in turbo machinery, combustors, engines, cylinders and other engineering parts. However, for polymeric and other soft surfaces the more commonly reported measurement number is related to specular reflectivity, the Ra and Rq are generally not called-out.

The use of thermal plasma is a versatile method that may be used to reduce the surface roughness for metals, ceramics or soft plastics. With the application of thermal plasma one may rapidly de-burr down to Rq numbers in the order of about 1 um, depending on the ions used and other properly set conditions that change for specific alloy surfaces. Sand Castings with Ra=50 um can be reduced to Ra or the order of 1 um. Under certain conditions nanometer roughness values may be attempted.

Application of thermal plasma can de-burr, ionic co-deposit to fill surface porosity and be used simultaneously for thermal action in different modes to obtain the best surface. Numerous studies are underway for smoothening glasses, semiconductors and high hardness materials such as carbides, nitrides and borides. Selective smoothening studies with composites and multi-compositional alloys are underway also.

Every competitive de-burring process has advantages and disadvantages. When comparing processes the comparison should include speed, reliability, possibility of starting with high roughness for any process, energy efficiency, chemicals and other environmental foot-print including noise for comparison making. Mechanical processing (such as drilling, grinding, stone-tumbling and polishing) may change or damage materials on account of focused stresses which then may lead to residual cracks, residual tensile stresses and/or changes in the microstructure; thus reducing the service life of the part. Electro-polishing may require chemicals that need to be stored, replenished and disposed. The thermal plasma method, on the other hand, uses only air (or other gas of choice) and electricity as input to the machine. High kinetic and thermal energy ions are used for de-burring with this method. It is a noiseless and controllable process and because of the small foot print may be used on a table-top for almost all configurations. No water cooling or water/contaminant emissions. Continuous production with a belt or robot part-handler is easily possible.

Rapid de-burring can be combined with a rapid surface and bulk sintering. The ions do not require line-of-sight beam and the product do not have to be electrically grounded. This type of sintering is called 3DSintering™ which is a Trademark of MHI Inc. Simultaneous ion peening operations are envisioned. Similarly welding and weld smoothing may be anticipated as simultaneously feasible. Welding scale and the chromium depleted layer underneath weld roughness must be removed for example for Stainless Steel sea-side corrosion resistance. Mechanical polishing to match the finish on the parent material is often used but this must be done carefully so that cracks are not introduced which can lead to stress-corrosion cracking. Sometimes surface roughness is further reduced by deposition.

Example: Starting from a surface with a Ra=20-40 um (for an unsintered powder metallurgy produced alloy part for an alloy that sinters around 1700K) a Ra=4 um surface is easily obtained in minutes to an hour of non-line-of-sight surface thermal plasma de-burring operation. Multiple parts can be made simultaneously. The production cost saving per part when comparing labor time for 1 hour vs. 3 days is substantial. The savings from lessened environment degradation is substantial. The energy savings per year could be thousands of dollars in benefit.

Other applications of the method are envisioned as well. These methods may or may not include the use of a wrapping foil or the pre-coating of the object or surface prior to application of the thermal plasma. Glass may be effectively bent, shaped and textured by the application of thermal plasma at specific temperatures and exposure times. Such a glass texturing application comprises the application of a liquid polymeric compound to a frosted of glass surface or glass surface with imperfections, followed by the application of thermal plasma, possibly thermal cascade plasma. Such plasma produces the needed heat very quickly and cleanly. There are no environmentally unfriendly bi-products produced by the electric generation of the thermal plasma.

The applied polymeric compound may be a clear insulative varnish comprised of xylene, acetone, propane, butane or toluene Carbon, phosphorous, oxygen, nitrogen and hydrogen may be present as well. Similar compounds may be used having a refractive index near that of clear water. Compounds similar to nail polish are envisioned as well.

The plasma produces ions that contact the surface of the glass and the polymeric compound causing an effect which aids in the smoothing of the glass and the loss of any frosted appearance. The refractive indexes of the glass and liquid or other added compound appear to match before and after heating whether the compound remains in some form or is removed or burnt off by the process. The result is a smooth transparent surface produced with a clean and efficient electric generation of plasma.

Bending of glass may be effected by the application of thermal plasma without a pre-coating. However, the use of a boron nitride or carbonaceous tape can further enhance processing speeds for shaping and bending thin or thick glass. The plasma for such an operation may be steam plasma.

Abrasive wheels may be reconditioned by exposure to thermal plasma. Hard-facing is feasible for small to very large surfaces that are used for boring and grinding. Generally boron nitride, carbon nitrides and other surfaces such as AlNTi, with or without carbon and nano silica, may be formed. The use of nano silica and other nano colloids like nano alumina, zirconia may be added to the plume for enhanced deposition. Air may be employed to generate the thermal plasma which then will ionize and quickly form a hard and shiny abrasive surface useful for grinding hard ceramics. The regrowth of carbon (diamonds) with and without nitrides with this unusual plume has been realized.

Figure 5:
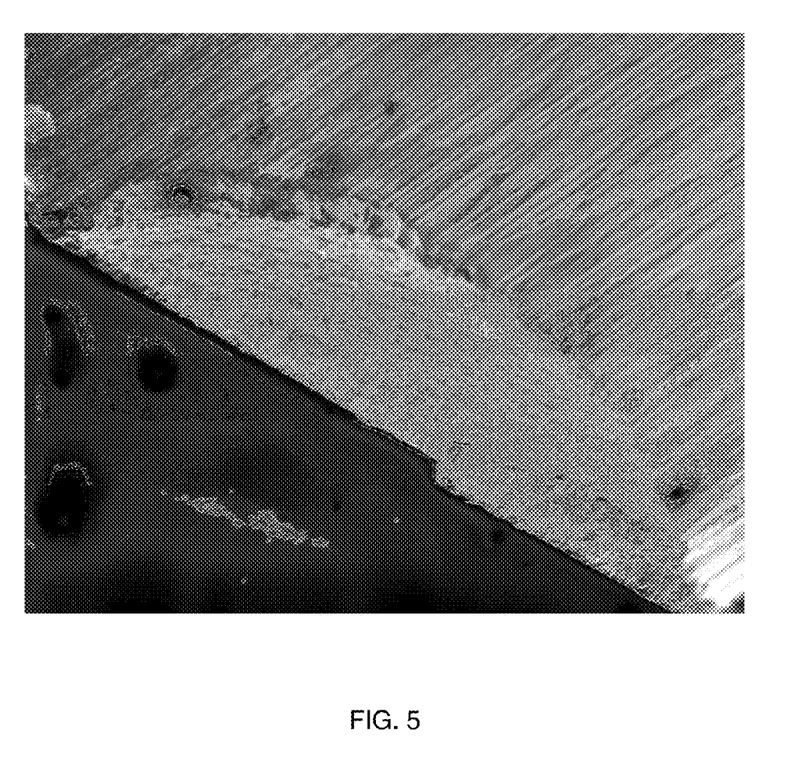
FIG. 5 is a cross section of a drill bit with in situ coating produced by the application of thermal plasma.

In all applications, powder, gas or liquids may be added to the plasma plume to provide a desired coating. The application of coatings may be over the entire surface or be controlled by square, multi-exit, narrow-focused or wide-slit apertures. As an example, in situ biomedical coatings have been applied to Ti6AL4V using the presented thermal plasma process. Other in situ coatings including nitride coatings may be possible as well (See FIG. 5). In situ coatings are coatings that have grown from the surface of an object itself rather than a coating of a material that has been physically or chemically applied to a surface. The action of the thermal plasma itself causes the coating to develop without the aid of any deposition. Applied coatings or affected surfaces may be non-stick in nature as well.

The above descriptions provide examples of specifics of possible embodiments of the application and should not be used to limit the scope of all possible embodiments. Thus, the scope of the embodiments should not be limited by the examples and descriptions given, but should be determined from the claims and their legal equivalents.

We claim:

1. A method for the rapid thermal treatment of surfaces in a non-vacuum environment comprising generating a thermal plasma plume through the heating of a gaseous flow, placing of the surfaces in the thermal plasma plume, applying thermal plasma to the surfaces and encasing the surfaces with a wrapping material during the applying of the thermal plasma, whereby the surfaces under the wrapping material experience a rapid heat-up.

2. The method of claim 1 wherein the wrapping material is comprised of carbon.

3. The method of claim 1 wherein the wrapping material is a foil.

4. The method of claim 1 further comprising the application of radiant heat concurrent with the applying of the thermal plasma.

5. The method claim 1 wherein the surfaces are comprised of glass.

6. The method of claim 5 further comprising treating the glass with a coating prior to the applying of the thermal plasma plume.

7. The method of claim 6 wherein the coating is a polymer.

8. The method of claim 5 wherein the thermal treatment of the glass comprises the shaping of the glass.

9. The method of claim 8 wherein the shaping of the glass comprises bending of the glass.

10. The method of claim 5 wherein the thermal treatment of the glass comprises providing a clear surface to the glass.

11. The method of claim 1 further comprising introducing materials from the list including, powders, liquids and gases, into the thermal plasma plume prior to the applying of the thermal plasma to the surfaces resulting in the application of a deposited coating on the surfaces.

* * * * *